US012588286B2

(12) United States Patent
Luo et al.

(10) Patent No.: US 12,588,286 B2
(45) Date of Patent: Mar. 24, 2026

(54) DISPLAY PANEL AND MANUFACTURING METHOD THEREOF

(71) Applicant: TCL China Star Optoelectronics Technology Co., Ltd., Shenzhen (CN)

(72) Inventors: Chuanbao Luo, Shenzhen (CN); Kai Zhou, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 619 days.

(21) Appl. No.: 17/796,655

(22) PCT Filed: Jul. 29, 2022

(86) PCT No.: PCT/CN2022/109047
§ 371 (c)(1),
(2) Date: Jul. 31, 2022

(87) PCT Pub. No.: WO2024/007389
PCT Pub. Date: Jan. 11, 2024

(65) Prior Publication Data
US 2024/0186336 A1      Jun. 6, 2024

(30) Foreign Application Priority Data

Jul. 4, 2022     (CN) .......................... 202210781369.5

(51) Int. Cl.
*H10D 86/60*        (2025.01)
*H10D 86/01*        (2025.01)
*H10D 86/40*        (2025.01)

(52) U.S. Cl.
CPC ......... *H10D 86/60* (2025.01); *H10D 86/0221* (2025.01); *H10D 86/451* (2025.01)

(58) Field of Classification Search
CPC .. H10D 86/60; H10D 86/0221; H10D 86/451; H10D 30/6755; H10D 86/423; H10D 86/441; H10K 59/12
See application file for complete search history.

(56) References Cited

U.S. PATENT DOCUMENTS 7,279,765 B2 * 10/2007 Ahn .................... G02F 1/13439
216/96
10,281,783 B2 * 5/2019 Mochizuki ........... H10D 86/441
(Continued)

FOREIGN PATENT DOCUMENTS

CN        102799038        11/2012
CN        104752516        7/2015
(Continued)

OTHER PUBLICATIONS

International Search Report and the Written Opinion Dated Dec. 29, 2022 From the International Searching Authority Re. Application No. PCT/CN2022/109047 and Its Translation Into English. (19 Pages).
(Continued)

*Primary Examiner* — Tan N Tran

(57) ABSTRACT

A display panel and a manufacturing method thereof are disclosed. The display panel includes an oxide active part, a gate electrode, conduction protective parts, a passivation part, and a source-drain electrode. The oxide active part includes a semiconductor part and conductor parts, and the passivation part is disposed on the gate electrode and the conduction protective parts. The source-drain electrode is disposed on one side of the conduction protective parts and the oxide active part and is connected to the conductor parts. Therefore, a reaction between the passive part and the conductor parts is less likely to occur, thereby ensuring a performance of the display panel.

17 Claims, 3 Drawing Sheets

(56)  References Cited

U.S. PATENT DOCUMENTS

| | | | | |
|---|---|---|---|---|
| 10,439,050 | B2 * | 10/2019 | Sakata | .............. H01L 21/02631 |
| 11,335,759 | B2 * | 5/2022 | Baek | .................... H10K 59/131 |

FOREIGN PATENT DOCUMENTS

| | | |
|---|---|---|
| CN | 107507867 | 12/2017 |
| CN | 108878295 | 11/2018 |
| CN | 110931505 | 3/2020 |
| CN | 111403425 | 7/2020 |
| CN | 211743124 | 10/2020 |
| CN | 112086481 | 12/2020 |
| CN | 113745243 | 12/2021 |
| CN | 114447120 | 5/2022 |
| JP | 2020-009911 | 1/2020 |

OTHER PUBLICATIONS

Notification of Office Action and Search Report Dated May 8, 2025 From the State Intellectual Property Office of the People's Republic of China Re. Application No. 202210781369.5 and Its Translation Into English. (17 Pages).

* cited by examiner

DISPLAY PANEL AND MANUFACTURING METHOD THEREOF

This application is a National Phase of PCT Patent Application No. PCT/CN2022/109047 having International filing date of Jul. 29, 2022, which claims the benefit of priority of Chinese Patent Application No. 202210781369.5 filed on Jul. 4, 2022. The contents of the above applications are all incorporated by reference as if fully set forth herein in their entirety.

FIELD AND BACKGROUND OF THE INVENTION

The present disclosure relates to the field of display technologies, and more particularly, to a display panel and a manufacturing method thereof.

At present, in top-gate transistors, passivation layers are formed on active layers and are directly in contact with conductor parts. The passivation layers are generally formed by TiOx or AlOx, so higher powers are needed to deposit the passivation layers, causing the passivation layers to react with the conductor parts easily. That is, oxygen in the passivation layers easily enters the conductor parts of the active layers during the sputtering process, resulting in an increase of oxygen in the active layers, and oxygen vacancies are correspondingly reduced to cause an increase in resistances. Therefore, devices will be turned on abnormally due to the increase in resistances.

Technical problem: an embodiment of the present disclosure provides a display panel and a manufacturing method thereof to solve the problem of the passivation layers being prone to react with the conductor parts in current technology.

SUMMARY OF THE INVENTION

An embodiment of the present disclosure provides a display panel, which includes:

a substrate;

an oxide active part disposed on the substrate, wherein, the oxide active part includes a semiconductor part and conductor parts disposed on both sides of the semiconductor part;

a gate insulating part disposed on the oxide active part and corresponding to the semiconductor part;

a gate electrode disposed on the gate insulating part;

conduction protective parts disposed on the conductor parts and in contact with the conductor parts, wherein, the conduction protective parts are insulated from the gate electrode;

a passivation part disposed on the gate electrode and the conduction protective parts; and a source-drain electrode disposed on one side of the conduction protective parts and the oxide active part and connected to the conductor parts.

Optionally, in some embodiments of the present disclosure, a material of the conduction protective parts includes at least one of metal oxide conductive materials or metal materials.

Optionally, in some embodiments of the present disclosure, a square resistance of the conduction protective parts is less than 150 $\Omega$/sq.

Optionally, in some embodiments of the present disclosure, a material of the conduction protective parts includes at least one of indium tin oxide (ITO), indium zinc oxide (IZO), Cu, or Fe.

Optionally, in some embodiments of the present disclosure, a thickness of the conduction protective parts is less than a thickness of the gate insulating part.

Optionally, in some embodiments of the present disclosure, the thickness of the conduction protective parts ranges from 50 nm to 100 nm.

Optionally, in some embodiments of the present disclosure, the display panel further includes a pixel electrode disposed on the passivation part and connected to the source-drain electrode, wherein, an orthographic projection of the semiconductor part on the substrate is located within an orthographic projection of the pixel electrode on the substrate.

Optionally, in some embodiments of the present disclosure, the source-drain electrode is disposed on the substrate, the display panel further includes a buffer layer disposed on the source-drain electrode and the substrate, the oxide active part is disposed on the buffer layer, the conductor parts are connected to the source-drain electrode, and the pixel electrode is connected to the conduction protective parts.

Optionally, in some embodiments of the present disclosure, the buffer layer is defined with through-holes penetrating through the buffer layer to expose the source-drain electrode, and the conductor parts extend into the through-holes and are connected to the source-drain electrode.

Optionally, in some embodiments of the present disclosure, the display panel further includes a passivation protective part disposed on the passivation part, the passivation protective part is defined with a via-hole penetrating through the passivation protective part and the passivation part to expose the conduction protective parts, and the pixel electrode extends into the via-hole and is connected to the conduction protective parts.

Optionally, in some embodiments of the present disclosure, the source-drain electrode includes a source electrode and a drain electrode spaced apart from each other and disposed in a same layer; the source electrode is disposed under and connected to one of the conductor parts, and the drain electrode is disposed under and connected to another one of the conductor parts; and the orthographic projection of the semiconductor part on the substrate is located within an orthographic projection of the drain electrode on the substrate.

An embodiment of the present disclosure further provides a display panel, which includes:

a substrate;

an oxide active part disposed on the substrate, wherein, the oxide active part includes a semiconductor part and conductor parts disposed on both sides of the semiconductor part;

a gate insulating part disposed on the oxide active part and corresponding to the semiconductor part;

a gate electrode disposed on the gate insulating part;

conduction protective parts disposed on the conductor parts and in contact with the conductor parts, wherein, the conduction protective parts are spaced apart from the gate electrode, a material of the conduction protective parts includes at least one of metal oxide conductive materials or metal materials, and a thickness of the conduction protective parts is less than a thickness of the gate insulating part;

a passivation part disposed on the gate electrode and the conduction protective parts; and a source-drain electrode disposed on one side of the conduction protective parts and the oxide active part and connected to the conductor parts.

Optionally, in some embodiments of the present disclosure, a square resistance of the conduction protective parts is less than 150 Ω/sq.

Optionally, in some embodiments of the present disclosure, a material of the conduction protective parts includes at least one of indium tin oxide (ITO), indium zinc oxide (IZO), Cu, or Fe.

Optionally, in some embodiments of the present disclosure, the display panel further includes a pixel electrode disposed on the passivation part and connected to the source-drain electrode, wherein, an orthographic projection of the semiconductor part on the substrate is located within an orthographic projection of the pixel electrode on the substrate.

Optionally, in some embodiments of the present disclosure, the source-drain electrode is disposed on the substrate, the display panel further includes a buffer layer disposed on the source-drain electrode and the substrate, the oxide active part is disposed on the buffer layer, the conductor parts are connected to the source-drain electrode, and the pixel electrode is connected to the conduction protective parts.

Optionally, in some embodiments of the present disclosure, the buffer layer is defined with through-holes penetrating through the buffer layer to expose the source-drain electrode, and the conductor parts extend into the through-holes and are connected to the source-drain electrode.

Optionally, in some embodiments of the present disclosure, the display panel further includes a passivation protective part disposed on the passivation part, the passivation protective part is defined with a via-hole penetrating through the passivation protective part and the passivation part to expose the conduction protective parts, and the pixel electrode extends into the via-hole and is connected to the conduction protective parts.

Optionally, in some embodiments of the present disclosure, the source-drain electrode includes a source electrode and a drain electrode spaced apart from each other and disposed in a same layer; the source electrode is disposed under and connected to one of the conductor parts, and the drain electrode is disposed under and connected to another one of the conductor parts; and the orthographic projection of the semiconductor part on the substrate is located within an orthographic projection of the drain electrode on the substrate.

An embodiment of the present disclosure further provides a manufacturing method of a display panel. The method includes following steps:

depositing a first metal layer on a substrate by physical vapor sputtering and patterning the first metal layer to form a source-drain electrode;

using chemical vapor deposition to form a buffer layer material on the source-drain electrode and the substrate, and annealing and patterning the buffer layer material to form a buffer layer;

forming an active layer on the buffer layer;

successively depositing a gate insulating layer and a second metal layer on the buffer layer and the active layer, patterning the second metal layer to form a gate electrode, and patterning the gate insulating layer to form a gate insulating part by self-alignment of the gate electrode; performing a plasma treatment on the active layer to allow the active layer to form an oxide active part, wherein, the oxide active part includes a semiconductor part and conductor parts disposed on both sides of the semiconductor part;

depositing an oxide protective layer on the conductor parts, the gate electrode, and the gate insulating layer by physical vapor sputtering, and patterning the oxide protective layer to form conduction protective parts;

sputtering to laminate a passivation layer and a passivation protective layer in sequence on the conduction protective parts, the gate electrode, and the gate insulating part, and performing a plasma treatment to allow the passivation layer to form a passivation part and allow the passivation protective layer to from a passivation protective part; and disposing a metal oxide layer on the passivation protective part by physical vapor deposition, and patterning to form a pixel electrode.

Beneficial effect: the present disclosure discloses the display panel and the manufacturing method thereof. The display panel includes a substrate, an oxide active part, a gate insulating part, a gate electrode, conduction protective parts, a passivation part, and a source-drain electrode. The oxide active part is disposed on the substrate, wherein, the oxide active part includes a semiconductor part and conductor parts disposed on both sides of the semiconductor part. The gate insulating part is disposed on the oxide active part and corresponds to the semiconductor part. The gate electrode is disposed on the gate insulating part. The conduction protective parts are disposed on the conductor parts and in contact with the conductor parts, wherein, the conduction protective parts are insulated from the gate electrode. The passivation part is disposed on the gate electrode and the conduction protective parts. The source-drain electrode is disposed on one side of the conduction protective parts and the oxide active part, and is connected to the conductor parts. In the present disclosure, the conduction protective parts are disposed between the conductor parts and the passivation part, so a reaction between the passive part and the conductor parts is less likely to occur, thereby ensuring a performance of the display panel.

BRIEF DESCRIPTION OF THE SEVERAL VIEWS OF THE DRAWINGS

The accompanying figures to be used in the description of embodiments of the present disclosure will be described in brief to more clearly illustrate the technical solutions of the embodiments. The accompanying figures described below are only part of the embodiments of the present disclosure, from which those skilled in the art can derive further figures without making any inventive efforts.

Figure 1:
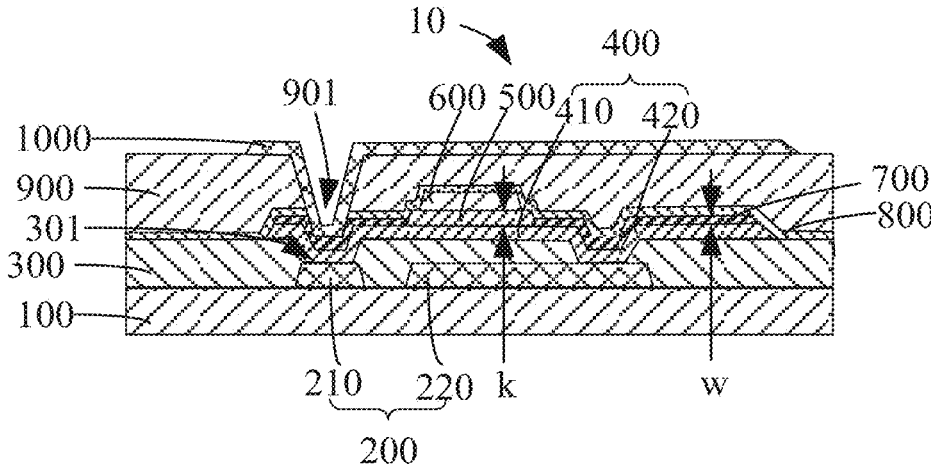
FIG. 1 is a first schematic structural diagram of a display panel according to an embodiment of the present disclosure.

Elements in the drawings are designated by reference numerals listed below.

display panel 10; substrate 100; source-drain electrode 200; source electrode 210; drain electrode 220; buffer layer 300; through-hole 301; oxide active part 400; semiconductor part 410; conductor part 420; gate insulating part 500; gate electrode 600; conduction protective part 700; passivation part 800; passivation protective part 900; via-hole 901; and pixel electrode 1000.

DESCRIPTION OF SPECIFIC EMBODIMENTS OF THE INVENTION

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure, and are not used to limit the disclosure. In the present disclosure, in the case of no explanation to the contrary, the orientation words used such as "on" and "under" usually refer to upper and lower directions of the device in actual use or working state, and specifically the directions in the drawings; and "inside" and "outside" refer to the outline of the device. In the present disclosure, "reaction" may be either a chemical reaction or a physical reaction.

The present disclosure discloses a display panel. The display panel includes a substrate, an oxide active part, a gate insulating part, a gate electrode, conduction protective parts, a passivation part, and a source-drain electrode. The oxide active part is disposed on the substrate, wherein, the oxide active part includes a semiconductor part and conductor parts disposed on both sides of the semiconductor part. The gate insulating part is disposed on the oxide active part and corresponds to the semiconductor part. The gate electrode is disposed on the gate insulating part. The conduction protective parts are disposed on the conductor parts and in contact with the conductor parts, wherein, the conduction protective parts are insulated from the gate electrode. The passivation part is disposed on the gate electrode and the conduction protective parts. The source-drain electrode is disposed on one side of the conduction protective parts and the oxide active part, and is connected to the conductor parts.

In the present disclosure, by disposing the conduction protective parts between the conductor parts and the passivation part, during or after formation of the passivation part, the passivation part is not prone to react with or diffuse to the conductor parts, thereby preventing an increase of oxygen contents and a reduction of oxygen vacancies in the oxide active part. Therefore, a resistance of the oxide active part can be prevented from rising, thereby preventing an abnormal turn-on of the display panel, while improving an encapsulation effect of the display panel, thereby ensuring a performance of the display panel.

They are described in detail in the following.

Referring to FIG. 1, the present disclosure provides a display panel 10. The display panel 10 includes a substrate 100, a buffer layer 300, a source-drain electrode 200, an oxide active part 400, a gate insulating part 500, a gate electrode 600, conduction protective parts 700, a passivation part 800, a passivation protective part 900, and a pixel electrode 1000.

The source-drain electrode 200 is disposed on the substrate 100. Specifically, a material of the source-drain electrode 200 includes at least one of Mo, Cu, or an alloy thereof. The source-drain electrode 200 includes a source electrode 210 and a drain electrode 220 spaced apart from each other and disposed in a same layer.

The buffer layer 300 is disposed on the substrate 100. The buffer layer 300 is defined with through-holes 301. The through-holes 301 penetrate through the buffer layer 300 to expose the source-drain electrode 200.

The oxide active part 400 is disposed on the substrate 100. The oxide active part 400 includes a semiconductor part 410 and conductor parts 420 disposed on both sides of the semiconductor part 410. Specifically, the oxide active part 400 is disposed on the buffer layer 300. The source electrode 210 is disposed under one of the conductor parts 420 and is connected thereto. The drain electrode 220 is disposed under another one of the conductor parts 420 and is connected thereto. An orthographic projection of the semiconductor part 410 on the substrate 100 is located within an orthographic projection of the drain electrode 220 on the substrate 100. A material of the oxide active part 400 includes semiconductor metal oxides, such as indium gallium zinc oxide (IGZO), indium gallium zinc tin oxide (IGZTO), or indium gallium tin oxide (IGTO).

In the present disclosure, since the orthographic projection of the semiconductor part 410 on the substrate 100 is located within the orthographic projection of the drain electrode 220 on the substrate 100, the drain electrode 220 can be multiplexed as a light-shielding part, thereby preventing external light from entering the semiconductor part 410, thereby ensuring the performance of the display panel 10.

The gate insulating part 500 is disposed on the oxide active part 400 and corresponds to the semiconductor part 410. Specifically, a material of the gate insulating part 500 includes at least one of SiOx or SiNx.

The gate electrode 600 is disposed on the gate insulating part 500. The source-drain electrode 200, the oxide active part 400, the gate electrode 600, and the gate insulating part 500 constitute a top-gate transistor.

The conduction protective parts 700 are disposed on the conductor parts 420 and are in contact with the conductor parts 420. The conduction protective parts 700 are spaced apart from the gate electrode 600. A material of the conduction protective parts 700 includes at least one of metal oxide conductive materials or metal materials.

In the present disclosure, the conduction protective parts 700 are disposed on the conductor parts 420, and the material of the conduction protective parts 700 includes at least one of metal oxide conductive materials or metal materials, so that during or after formation of the passivation part 800, the passivation part 800 is not prone to react with the conductor parts 420, thereby preventing an increase of oxygen contents and a reduction of oxygen vacancies in the oxide active part 400. Therefore, a resistance of the oxide active part 400 can be prevented from rising, thereby preventing an abnormal turn-on of the display panel 10, while blocking water and oxygen from entering the transistor, thereby improving an encapsulation effect of the display panel 10 and ensuring a performance of the display panel 10. Disposing the conduction protective parts 700 on the conductor parts 420 can prevent from damaging the conductor parts 420 when plasma etching is used for subsequent passivation part 800, thereby ensuring the quality of the oxide active part 400, thereby ensuring the performance of the display panel 10.

It should be noted that the oxygen contents refer to a ratio of oxygen atoms in all atoms in the film layer.

In an embodiment, the material of the conduction protective parts 700 includes at least one of indium tin oxide (ITO), indium zinc oxide (IZO), Cu, or Fe.

In another embodiment, the conduction protective parts 700 are also disposed on the buffer layer 300. That is, a portion of the conduction protective parts 700 is disposed on the buffer layer 300. Disposing the conduction protective parts 700 on the buffer layer 300 and the semiconductor part 410 can reduce the precision requirements for forming the conduction protective parts 700, thereby reducing the cost.

In an embodiment, a thickness w of the conduction protective parts 700 is less than a thickness k of the gate insulating part 500. In the present disclosure, the thickness w of the conduction protective parts 700 is set to be less than the thickness k of the gate insulating part 500, so that the gate electrode 600 can be prevented from being in contact with the conduction protective parts 700 and causing short circuits, thereby ensuring the performance of the display panel 10.

In an embodiment, the thickness w of the conduction protective parts 700 ranges from 50 nm to 100 nm. Specifically, the thickness w of the conduction protective parts 700 may be 50 nm, 70 nm, 80 nm, or 100 nm. In the present disclosure, setting the thickness w of the conduction protective parts 700 to range from 50 nm to 100 nm can further prevent the gate electrode 600 from being in contact with the conduction protective parts 700 and causing short circuits, thereby ensuring the performance of the display panel 10.

The passivation part 800 is disposed on the gate electrode 600 and the conduction protective parts 700. Specifically, the passivation part 800 is disposed on the buffer layer 300, the gate electrode 600, the gate insulating part 500, and the conduction protective parts 700.

In an embodiment, a material of the passivation part 800 includes at least one of aluminum oxide or titanium oxide.

In an embodiment, a square resistance of the passivation part 800 is greater than or equal to 150 Ω/sq. Specifically, the square resistance of the passivation part 800 may be 150 Ω/sq, 180 Ω/sq, 190 Ω/sq, or 220 Ω/sq, etc. A square resistance of the conduction protective parts 700 is less than 150 Ω/sq. Specifically, the square resistance of the conduction protective parts 700 may be 30 Ω/sq, 80 Ω/sq, 120 Ω/sq, or 150 Ω/sq. In the present disclosure, the square resistance of the conduction protective parts 700 is set to be less than 150 Ω/sq, so that during or after the formation of the passivation part 800, the passivation part 800 is not prone to react with or diffuse to the conductor parts 420, thereby ensuring the performance of the display panel 10.

The passivation protective part 900 is disposed on the passivation part 800. The passivation protective part 900 is defined with a via-hole 901. The via-hole 901 penetrates through the passivation protective part 900 and the passivation part 800 to expose the conduction protective parts 700. A material of the passivation protective part 900 includes at least one of SiOx or SiNx.

The pixel electrode 1000 is disposed on the passivation protective part 900. The orthographic projection of the semiconductor part 410 on the substrate 100 is located within an orthographic projection of the pixel electrode 1000 on the substrate 100. The pixel electrode 1000 extends into the via-hole 901 and is connected to the conduction protective parts 700. A material of the pixel electrode 1000 includes metal oxides such as IZO or ITO.

In the present disclosure, the orthographic projection of the semiconductor part 410 on the substrate 100 is set to be located within the orthographic projection of the pixel electrode 1000 on the substrate 100, so that the pixel electrode 1000 can be used as an encapsulation layer of the transistor, thereby further blocking water vapor from entering the semiconductor part 410. Therefore, reliability of the transistor can be improved.

Figure 2:
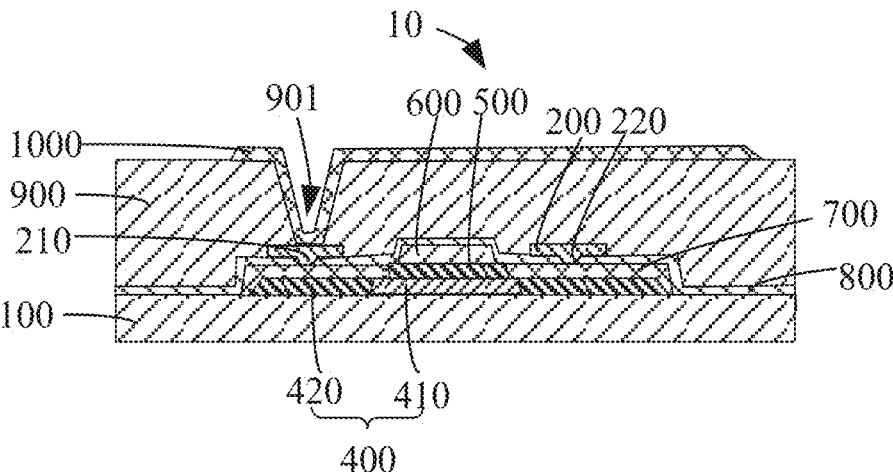
FIG. 2 is a second schematic structural diagram of the display panel according to an embodiment of the present disclosure.

Referring to FIG. 2, it should be noted that a difference between the second structure and the first structure is that the buffer layer is removed, and the source-drain electrode 200 is disposed on the passivation part 800 and is connected to the conductor parts 420 by through-holes. The passivation protective part 900 is disposed on the source-drain electrode 200 and the passivation part 800. The pixel electrode 1000 is connected to the source-drain electrode 200 by the via-hole 901. Others are same as those of the first structure and is not repeated herein.

Referring to FIGS. 3 to 9, the present disclosure further provides a manufacturing method of the display panel 10, which is configured to prepare the display panel 10 of the present disclosure. It will be described in detail in the following.

Figure 3:
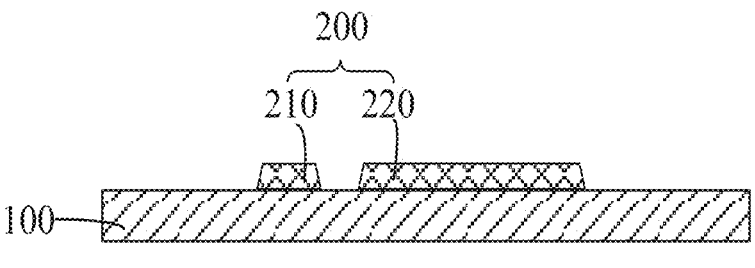
FIGS. 3, 4, 5, 6, 7, 8 and 9 are schematic processing-step diagrams of a manufacturing method of the display panel according to an embodiment of the present disclosure.

Referring to FIG. 3, a first metal layer is deposited on the substrate 100 by physical vapor sputtering, and the first metal layer is patterned to form the source-drain electrode 200.

Figure 4:
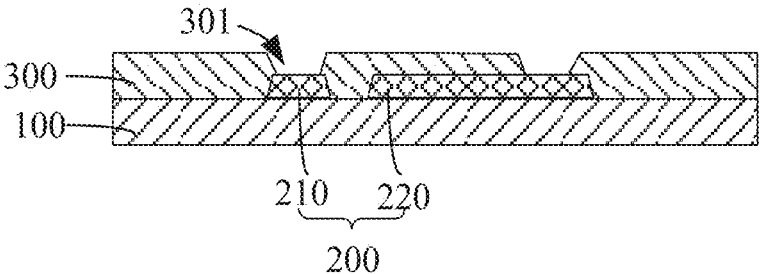

Referring to FIG. 4, then a buffer layer material is formed on the source-drain electrode 200 and the substrate 100 by chemical vapor deposition, and the buffer layer material forms the buffer layer 300 by annealing and patterning.

In the present disclosure, annealing the buffer layer material can eliminate impurities in the buffer layer material, thereby preventing the impurities from affecting the buffer layer 300, thereby ensuring the performance of the display panel 10.

In an embodiment, a time for annealing treatment ranges from 2 to 3 hours. Specifically, the time for annealing treatment may be 2 hours, 2.2 hours, 2.6 hours, or 3 hours. A temperature for the annealing treatment ranges from 300° C. to 400° C. Specifically, the temperature for the annealing treatment may be 300° C., 340° C., 370° C., or 400° C.

In the present disclosure, the time for the annealing treatment is set to range from 2 to 3 hours and the temperature for the annealing treatment is set to range from 300° C. to 400° C., which can further improve the effect of eliminating the impurities, thereby further ensuring the performance of the display panel 10.

Figure 5:
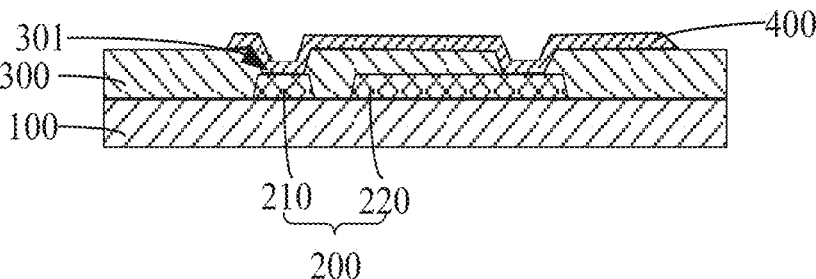

Referring to FIG. 5, then forming an active layer on the buffer layer 300.

Figure 6:
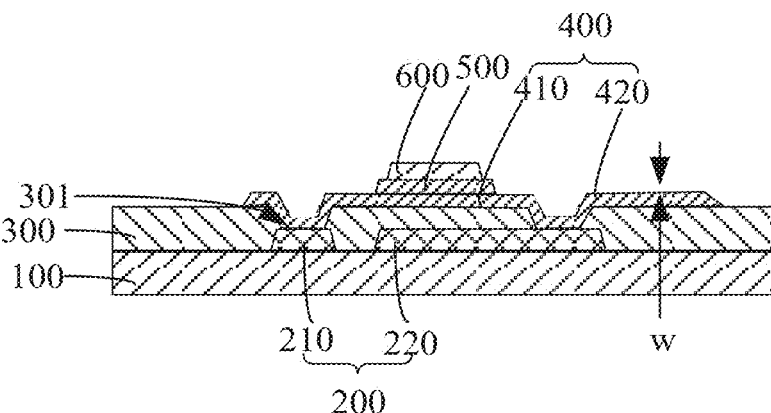

Referring to FIG. 6, then successively depositing a gate insulating layer and a second metal layer on the buffer layer 300 and the active layer, patterning the second metal layer to form the gate electrode 600, and patterning the gate insulating layer to form the gate insulating part 500 by self-alignment of the gate electrode 600. Then a plasma treatment is performed on the active layer to allow the active layer to form the oxide active part 400. The oxide active part 400 includes the semiconductor part 410 and the conductor parts 420 disposed on both sides of the semiconductor part 410.

Figure 7:
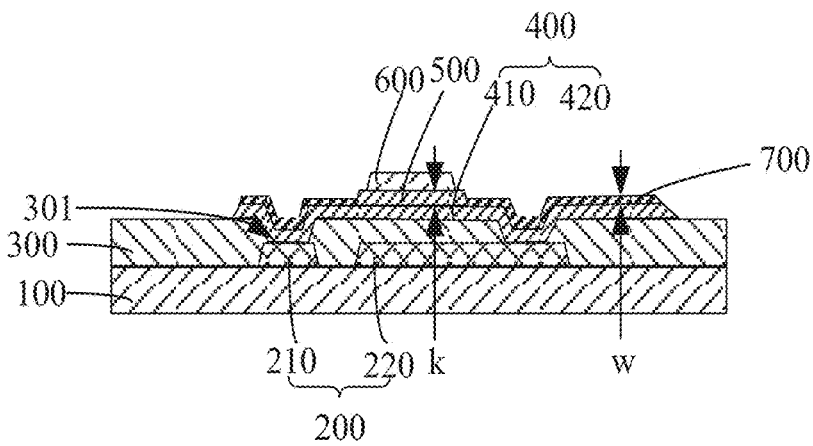

Referring to FIG. 7, then depositing an oxide protective layer on the conductor parts 420, the gate electrode 600, and the gate insulating layer by physical vapor sputtering, and patterning the oxide protective layer to form the conduction protective parts 700. The material of the conduction protective parts 700 includes at least one of indium tin oxide (ITO), indium zinc oxide (IZO), Cu, or Fe.

Figure 8:
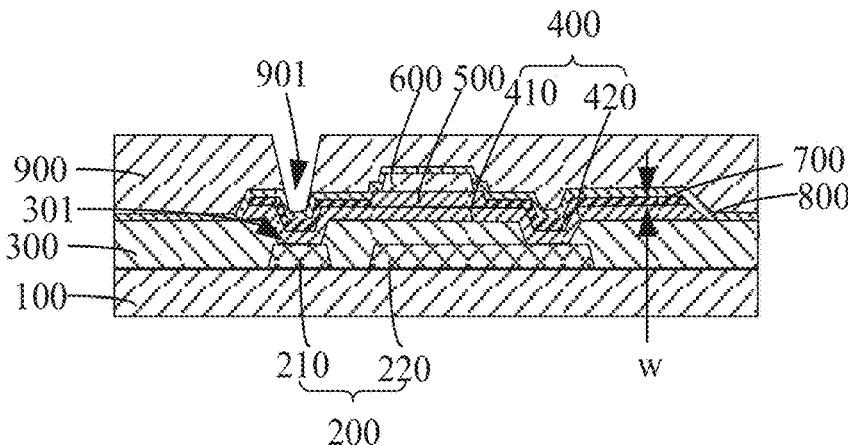

Referring to FIG. 8, then sputtering to laminate a passivation layer and a passivation protective layer in sequence on the conduction protective parts 700, the gate electrode 600, and the gate insulating part 500, and performing a plasma treatment to allow the passivation layer to form the passivation part 800 and allow the passivation protective layer to from the passivation protective part 900. The material of the passivation part 800 includes AlOx or TiOx. The material of the passivation protective part 900 includes at least one of SiOx or SiNx.

Figure 9:
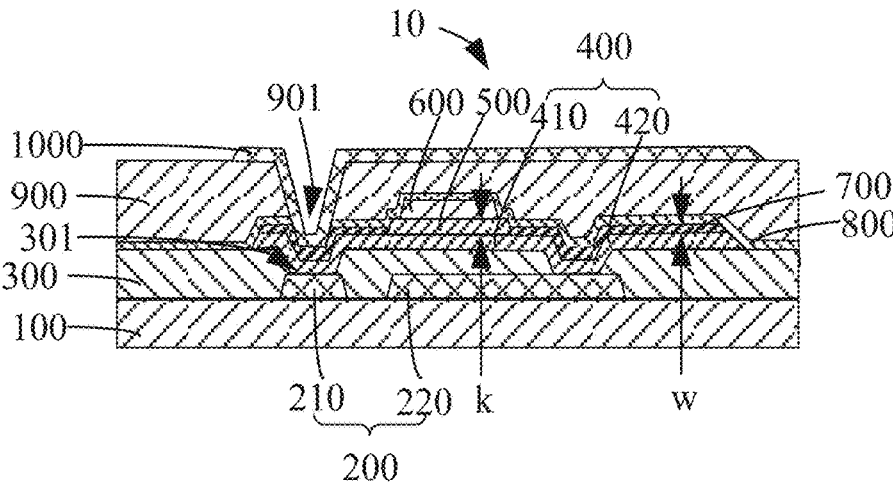

Referring to FIG. 9, then disposing a metal oxide layer on the passivation protective part 900 by physical vapor deposition, and patterning to form the pixel electrode 1000.

In another embodiment, after forming the oxide active part 400 on the buffer layer 300, the conduction protective parts 700 are directly formed on the buffer layer 300 and the oxide active part 400, and then film layers, such as the gate insulating part 500 and the gate electrode 600, are formed in sequence.

The present disclosure discloses the display panel 10. The display panel 10 includes the substrate 100, the oxide active part 400, the gate insulating part 500, the gate electrode 600, the conduction protective parts 700, the passivation part 800, and the source-drain electrode 200. The oxide active part 400 is disposed on the substrate 100, wherein, the oxide active part 400 includes the semiconductor part 410 and the conductor parts 420 disposed on both sides of the semiconductor part 410. The gate insulating part 500 is disposed on the oxide active part 400 and corresponds to the semiconductor part 410. The gate electrode 600 is disposed on the gate insulating part 500. The conduction protective parts 700 are disposed on the conductor parts 420 and are in contact with the conductor parts 420. The conduction protective parts 700 are spaced apart from the gate electrode 600, and the material of the conduction protective parts 700 includes at least one of metal oxide conductive materials or metal materials. The passivation part 800 is disposed on the gate electrode 600 and the conduction protective parts 700. The source-drain electrode 200 is disposed on one side of the conduction protective parts 700 and the oxide active part 400 and is connected to the conductor parts 420. In the present disclosure, the conduction protective parts 700 are disposed between the conductor parts 420 and the passivation part 800, and the material of the conduction protective parts 700 includes at least one of metal oxide conductive materials or metal materials, so that during or after the formation of the passivation part 800, the passivation part 800 is not prone to react with or diffuse to the conductor parts 420, thereby preventing the increase of oxygen contents and the reduction of oxygen vacancies in the oxide active part 400. Therefore, the resistance of the oxide active part 400 can be prevented from rising, thereby preventing the abnormal turn-on of the display panel 10, while improving the encapsulation effect of the display panel 10, thereby ensuring the performance of the display panel 10.

The display panel provided in the embodiments of the present disclosure is described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A display panel, comprising:
a substrate;
an oxide active part disposed on the substrate, wherein the oxide active part comprises a semiconductor part and conductor parts disposed on both sides of the semiconductor part;
a gate insulating part disposed on the oxide active part and corresponding to the semiconductor part;
a gate electrode disposed on the gate insulating part;
conduction protective parts disposed on the conductor parts and in contact with the conductor parts, wherein the conduction protective parts are insulated from the gate electrode;

a passivation part disposed on the gate electrode and the conduction protective parts;
a source electrode disposed under and connected to one of the conductor parts, a drain electrode disposed under and connected to another one of the conductor parts, wherein the source electrode and the drain electrode are disposed on the substrate; and
a buffer layer disposed on the source electrode and the drain electrode, as well as the substrate, wherein the buffer layer is defined with through-holes penetrating through the buffer layer to expose the source electrode and the drain electrode, and the conductor parts extend into the through-holes and are connected to the source electrode and the drain electrode.

2. The display panel according to claim 1, wherein a material of the conduction protective parts comprises at least one of metal oxide conductive materials or metal materials.

3. The display panel according to claim 2, wherein a square resistance of the conduction protective parts is less than 150 $\Omega$/sq.

4. The display panel according to claim 1, wherein a material of the conduction protective parts comprises at least one of indium tin oxide (ITO), indium zinc oxide (IZO), Cu, or Fe.

5. The display panel according to claim 1, wherein a thickness of the conduction protective parts is less than a thickness of the gate insulating part.

6. The display panel according to claim 5, wherein the thickness of the conduction protective parts ranges from 50 nm to 100 nm.

7. The display panel according to claim 1, further comprising a pixel electrode disposed on the passivation part and connected to one of the source electrode and the drain electrode, wherein an orthographic projection of the semiconductor part on the substrate is located within an orthographic projection of the pixel electrode on the substrate.

8. The display panel according to claim 7, wherein the oxide active part is disposed on the buffer layer, and the pixel electrode is connected to the conduction protective parts.

9. The display panel according to claim 8, further comprising a passivation protective part disposed on the passivation part, wherein the passivation protective part is defined with a via-hole penetrating through the passivation protective part and the passivation part to expose the conduction protective parts, and the pixel electrode extends into the via-hole and is connected to the conduction protective parts.

10. The display panel according to claim 9, wherein the source electrode and the drain electrode are spaced apart from each other and disposed in a same layer; and the orthographic projection of the semiconductor part on the substrate is located within an orthographic projection of the drain electrode on the substrate.

11. A display panel, comprising:
a substrate;
an oxide active part disposed on the substrate, wherein the oxide active part comprises a semiconductor part and conductor parts disposed on both sides of the semiconductor part;
a gate insulating part disposed on the oxide active part and corresponding to the semiconductor part;
a gate electrode disposed on the gate insulating part;
conduction protective parts disposed on the conductor parts and in contact with the conductor parts, wherein the conduction protective parts are insulated from the gate electrode, a material of the conduction protective parts comprises at least one of metal oxide conductive materials or metal materials, and a thickness of the conduction protective parts is less than a thickness of the gate insulating part;

a passivation part disposed on the gate electrode and the conduction protective parts;

a source electrode disposed under and connected to one of the conductor parts, a drain electrode disposed under and connected to another one of the conductor parts, wherein the source electrode and the drain electrode are disposed on the substrate; and a buffer layer disposed on the source electrode and the drain electrode, as well as the substrate, wherein the buffer layer is defined with through-holes penetrating through the buffer layer to expose the source electrode and the drain electrode, and the conductor parts extend into the through-holes and are connected to the source electrode and the drain electrode.

12. The display panel according to claim 11, wherein a square resistance of the conduction protective parts is less than 150 Ω/sq.

13. The display panel according to claim 11, wherein a material of the conduction protective parts comprises at least one of indium tin oxide (ITO), indium zinc oxide (IZO), Cu, or Fe.

14. The display panel according to claim 11, further comprising a pixel electrode disposed on the passivation part and connected to one of the source electrode and the drain electrode wherein an orthographic projection of the semiconductor part on the substrate is located within an orthographic projection of the pixel electrode on the substrate.

15. The display panel according to claim 14, wherein the oxide active part is disposed on the buffer layer, and the pixel electrode is connected to the conduction protective parts.

16. The display panel according to claim 15, further comprising a passivation protective part disposed on the passivation part, wherein the passivation protective part is defined with a via-hole penetrating through the passivation protective part and the passivation part to expose the conduction protective parts, and the pixel electrode extends into the via-hole and is connected to the conduction protective parts.

17. The display panel according to claim 16, wherein the source electrode and the drain electrode are spaced apart from each other and disposed in a same layer; and the orthographic projection of the semiconductor part on the substrate is located within an orthographic projection of the drain electrode on the substrate.

* * * * *